(12) United States Patent
Kim et al.

(10) Patent No.: US 6,911,362 B2
(45) Date of Patent: Jun. 28, 2005

(54) METHODS FOR FORMING ELECTRONIC DEVICES INCLUDING CAPACITOR STRUCTURES

(75) Inventors: Ki-Nam Kim, Gyeonggi-do (KR); Yoon-Jong Song, Seoul (KR); Heung-Jin Joo, Gyeonggi-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/635,195

(22) Filed: Aug. 6, 2003

(65) Prior Publication Data

US 2004/0042134 A1 Mar. 4, 2004

(30) Foreign Application Priority Data

Sep. 4, 2002 (KR) ................................. 10-2002-0053116

(51) Int. Cl.[7] ......................................... H01L 21/8242
(52) U.S. Cl. ....................... 438/240; 438/250; 438/254; 438/393; 438/397; 438/631; 438/650; 438/669; 438/686; 438/697; 438/745; 438/761; 438/778; 438/787; 438/791
(58) Field of Search ................................ 438/239, 240, 438/250, 253, 254, 393, 396, 397, 631, 650, 669, 686, 694, 697, 745, 760, 761, 778, 787, 791, 959, FOR 124, FOR 196, FOR 220, FOR 430

(56) References Cited

U.S. PATENT DOCUMENTS

| | | | | |
|---|---|---|---|---|
| 4,717,689 A | * | 1/1988 | Maas et al. ................... | 438/301 |
| 5,618,747 A | * | 4/1997 | Lou ............................. | 438/398 |
| 5,998,258 A | * | 12/1999 | Melnick et al. .............. | 438/253 |
| 6,020,233 A | * | 2/2000 | Kim ............................. | 438/240 |
| 6,143,604 A | * | 11/2000 | Chiang et al. ............... | 438/253 |
| 6,204,161 B1 | * | 3/2001 | Chung et al. ................. | 438/612 |
| 6,281,537 B1 | * | 8/2001 | Kim ............................ | 257/295 |
| 6,294,805 B1 | * | 9/2001 | Jung ........................... | 257/295 |
| 6,319,731 B1 | * | 11/2001 | Kang et al. ..................... | 438/3 |
| 6,376,325 B1 | * | 4/2002 | Koo ............................ | 438/396 |
| 6,420,272 B1 | * | 7/2002 | Shen et al. .................. | 438/702 |
| 6,717,196 B2 | * | 4/2004 | Joo ............................. | 257/295 |
| 2001/0053610 A1 | * | 12/2001 | Athavale et al. ............ | 438/710 |
| 2002/0125523 A1 | * | 9/2002 | Oh .............................. | 257/310 |
| 2003/0038323 A1 | * | 2/2003 | Kotani ....................... | 257/347 |
| 2003/0176073 A1 | * | 9/2003 | Ying et al. .................. | 438/710 |

* cited by examiner

Primary Examiner—George Fourson
Assistant Examiner—Joannie Adelle Garcia
(74) Attorney, Agent, or Firm—Myers Bigel Sibley & Sajovec

(57) ABSTRACT

Methods for forming an electronic device can include forming a capacitor structure on a portion of a substrate with the capacitor structure including a first electrode on the substrate, a capacitor dielectric on the first electrode, a second electrode on the dielectric, and a hard mask on the second electrode. More particularly, the capacitor dielectric can be between the first and second electrodes, the first electrode and the capacitor dielectric can be between the second electrode and the substrate, and the first and second electrodes and the capacitor dielectric can be between the hard mask and the substrate. An interlayer dielectric layer can be formed on the hard mask and on portions of the substrate surrounding the capacitor structure, and portions of the interlayer dielectric layer can be removed to expose the hard mask while maintaining portions of the interlayer dielectric layer on portions of the substrate surrounding the capacitor structure. The hard mask can then be removed thereby exposing portions of the second electrode while maintaining the portions of the interlayer dielectric layer on portions of the substrate surrounding the capacitor.

33 Claims, 9 Drawing Sheets

METHODS FOR FORMING ELECTRONIC DEVICES INCLUDING CAPACITOR STRUCTURES

RELATED APPLICATION

This application claims priority from Korean Patent Application No. 2002-53116 filed Sep. 4, 2002, in the Korean Intellectual Property Office, the disclosure of which is incorporated herein in its entirety by reference.

FIELD OF THE INVENTION

The present invention generally relates to methods of fabricating electronic devices and, more particularly, to methods of fabricating electronic devices including capacitor structures.

BACKGROUND OF THE INVENTION

A ferroelectric memory device has a non-volatile property to retain previous data even when a power supply is interrupted. Similar to a dynamic random access memory (DRAM) or a static random access memory (SRAM), the ferroelectric memory device operates at a relatively low power supply voltage. For these reasons, the ferroelectric memory device may be a promising candidate for use in applications such as smart cards.

A conventional method of fabricating a ferroelectric memory device is now described below with reference to FIG. 1 through FIG. 3. Referring to FIG. 1, device isolation layers 13 are formed at predetermined regions of a semiconductor device to define an active region therebetween. A plurality of insulated gate electrodes 15 (providing wordlines) are formed across the active region and the device isolation layer 13. Impurities are implanted into portions of the active region between gate electrodes 15 to form source/drain regions 17s and 17d. A first lower interlayer dielectric 19 is formed on a surface of the structure including source/drain regions 17s and 17d, device isolation layers 13, and gate electrodes 15. The first lower interlayer dielectric 19 is patterned to form storage node contact holes exposing the source regions 17s. Contact plugs 21 are formed in the storage node contact holes.

Referring to FIG. 2, ferroelectric capacitors 32 are formed on predetermined regions of the structure including the contact plugs 21. Each of the ferroelectric capacitors 32 includes a lower electrode 27, a ferroelectric pattern 29, and an upper electrode 31 which are sequentially stacked. The lower electrodes 27 cover their respective contact plugs 21. An inter-metal dielectric 33 is formed on a surface of the structure including the ferroelectric capacitors 32. Typically, the inter-metal dielectric 33 is made of silicon oxide.

Referring to FIG. 3, the inter-metal dielectric 33 is planarized down to a top surface of the upper electrode 31 to provide an inter-metal dielectric pattern 33'. To planarize the inter-metal dielectric 33, an etch-back process or a chemical mechanical polishing (CMP) process is carried out.

After planarization, a deposition thickness and an etch thickness may vary across different positions on a wafer. That is, the inter-metal dielectric 33 may be less etched at dotted circle 38 so that the upper electrode 31 is not exposed at dotted circle 38, as shown in the FIG. 3. In this case, the upper electrode 31 of ferroelectric capacitor 32 may be electrically isolated, thereby preventing proper operation. To address this situation, the inter-metal dielectric 33 may be overetched in the planarization process. However, the foregoing deviation in deposition and etch thickness may result in the inter-metal dielectric pattern 33' being overetched to expose the ferroelectric pattern 29 at dotted circuit 39. The exposure of the ferroelectric pattern 29 may give rise to deterioration of operation characteristics of the ferroelectric capacitor 32.

Reducing deviations in thicknesses of an inter-metal dielectric may be difficult due to limitations of processing tolerances of existing processing technologies. A realizable approach may be to form an upper electrode whose thickness is greater than a maximum thickness deviation across a wafer. This approach may reduce problems associated with the thickness deviations, but may cause the ferroelectric capacitor 32 to be thicker. The thicker the ferroelectric capacitor 32 is, the more difficult vertically patterning a sidewall of the ferroelectric capacitor 32 may become.

SUMMARY

According to embodiments of the present invention, methods for forming an electronic device can include forming a capacitor structure on a portion of a substrate with the capacitor structure including a first electrode on the substrate, a capacitor dielectric on the first electrode, a second electrode on the dielectric, and a hard mask on the second electrode. More particularly, the capacitor dielectric can be between the first and second electrodes, the first electrode and the capacitor dielectric can be between the second electrode and the substrate, and the first and second electrodes and the capacitor dielectric can be between the hard mask and the substrate. An interlayer dielectric layer can be formed on the hard mask and on portions of the substrate surrounding the capacitor structure, and portions of the interlayer dielectric layer can be removed to expose the hard mask while maintaining portions of the interlayer dielectric layer on portions of the substrate surrounding the capacitor structure. The hard mask can then be removed thereby exposing portions of the second electrode while maintaining the portions of the interlayer dielectric layer on portions of the substrate surrounding the capacitor.

After removing the hard mask layer, a plate line can be formed on the exposed portions of the second electrode, and the capacitor dielectric may include a ferroelectric material such as Pb(Zr,Ti)O$_3$ (PZT), Sr$_x$Bi$_{2+y}$Ta$_2$O$_9$ (SBT), and/or Bi$_{4-x}$La$_x$Ti$_3$O$_{12}$ (BLT). Removing portions of the interlayer dielectric layer may include planarizing the interlayer dielectric layer down to a level of the hard mask using a technique such as chemical mechanical polishing and/or an etching back.

In addition, the interlayer dielectric layer, the hard mask, and the second electrode may comprise different materials. Accordingly, the hard mask may be removed by etching the hard mask using an etchant that selectively etches the hard mask with respect to the interlayer dielectric layer and the second electrode. More particularly, the etchant may include phosphoric acid, and the hard mask may include a layer of at least one material selected from the group consisting of silicon nitride and/or titanium nitride.

Forming the capacitor structure may include forming a first electrode layer on the substrate, forming a dielectric layer on the lower electrode layer, forming a second electrode layer on the dielectric layer, and forming a hard mask layer on the second electrode layer. The hard mask layer can be patterned to provide the hard mask on the second electrode layer. Portions of the second electrode layer, the dielectric layer, and the first electrode layer can then be etched using the hard mask as an etching mask to provide the first electrode, the capacitor dielectric, and the second electrode. In addition, each of the first and second electrodes may include at least one material selected from the group consisting of ruthenium (Ru), platinum (Pt), iridium (Ir), rhodium (Rh), osmium (Os), and/or oxides thereof.

The hard mask may have a thickness in the range of approximately 50 nanometers to 200 nanometers. Moreover, a thickness of the hard mask may be greater than a variation in thickness of the portions of the interlayer dielectric layer maintained on portions of the substrate surrounding the capacitor structure after removing portions of the interlayer dielectric layer. The interlayer dielectric layer, for example, may be a layer of silicon oxide.

Methods according to embodiments of the present invention may additionally include forming a hydrogen barrier layer on the capacitor structure including the hard mask, the first and second electrodes, and the capacitor dielectric prior to forming the interlayer dielectric layer. More particularly, the hydrogen barrier layer may be a layer of a material selected from the group consisting of titanium oxide ($TiO_2$), aluminum oxide ($Al_2O_3$), zirconium oxide ($ZrO_2$), and cerium oxide ($CeO_2$). In addition, a memory cell access transistor may be formed prior to forming the capacitor structure wherein the first electrode of the capacitor structure is electrically connected to a source/drain region of the memory cell access transistor. In addition, an insulating layer can be formed on the memory cell access transistor prior to forming the capacitor structure wherein the insulating layer includes a via therein exposing a portion of the source/drain region of the memory cell access transistor, and wherein the first electrode is electrically connected to the source/drain region through the via.

DETAILED DESCRIPTION

Figure 1:
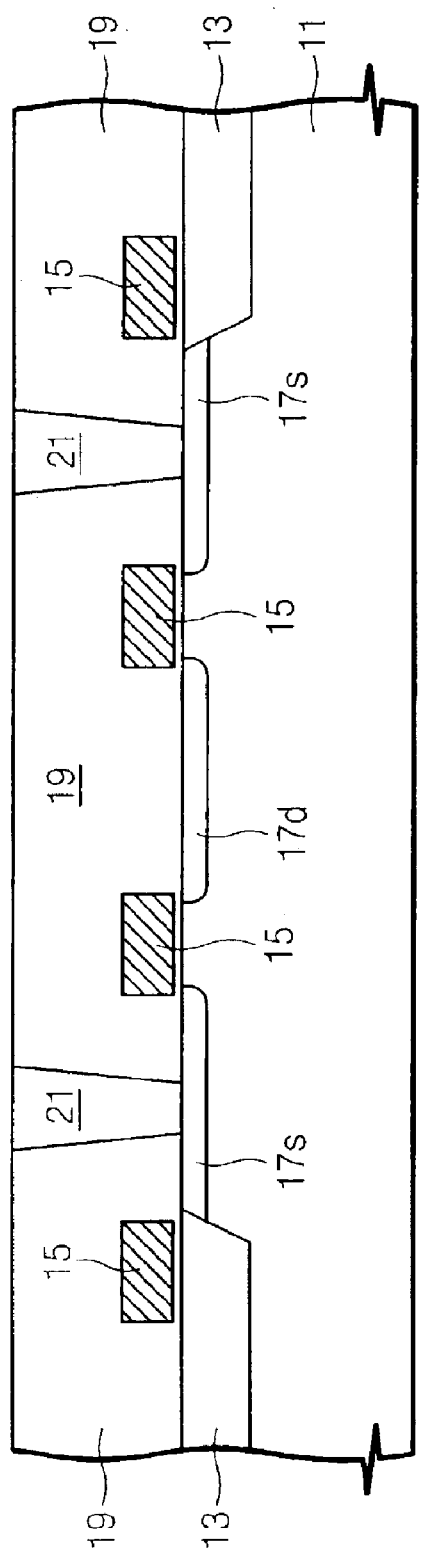
FIG. 1 through FIG. 3 are cross-sectional views illustrating a conventional method of fabricating a ferroelectric memory device.
Figure 2:
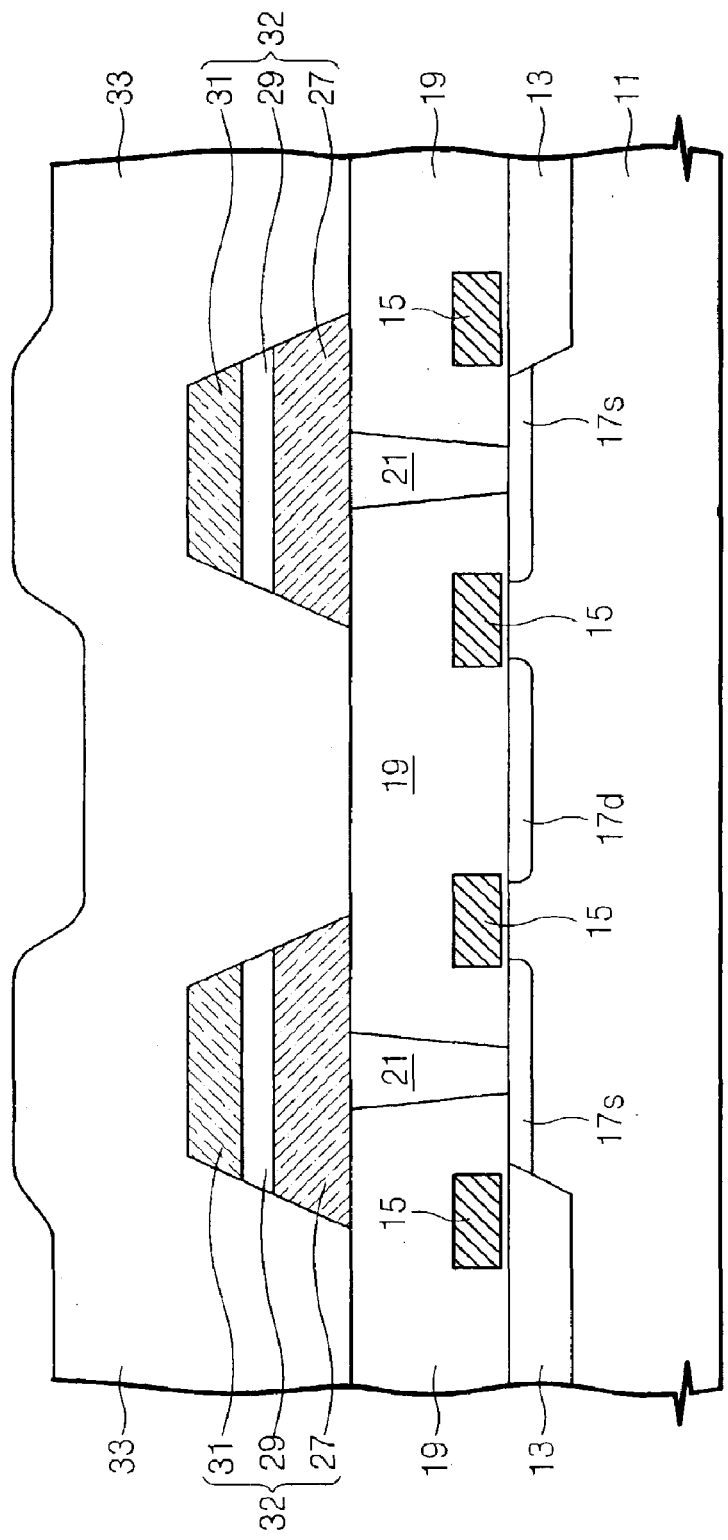
Figure 3:
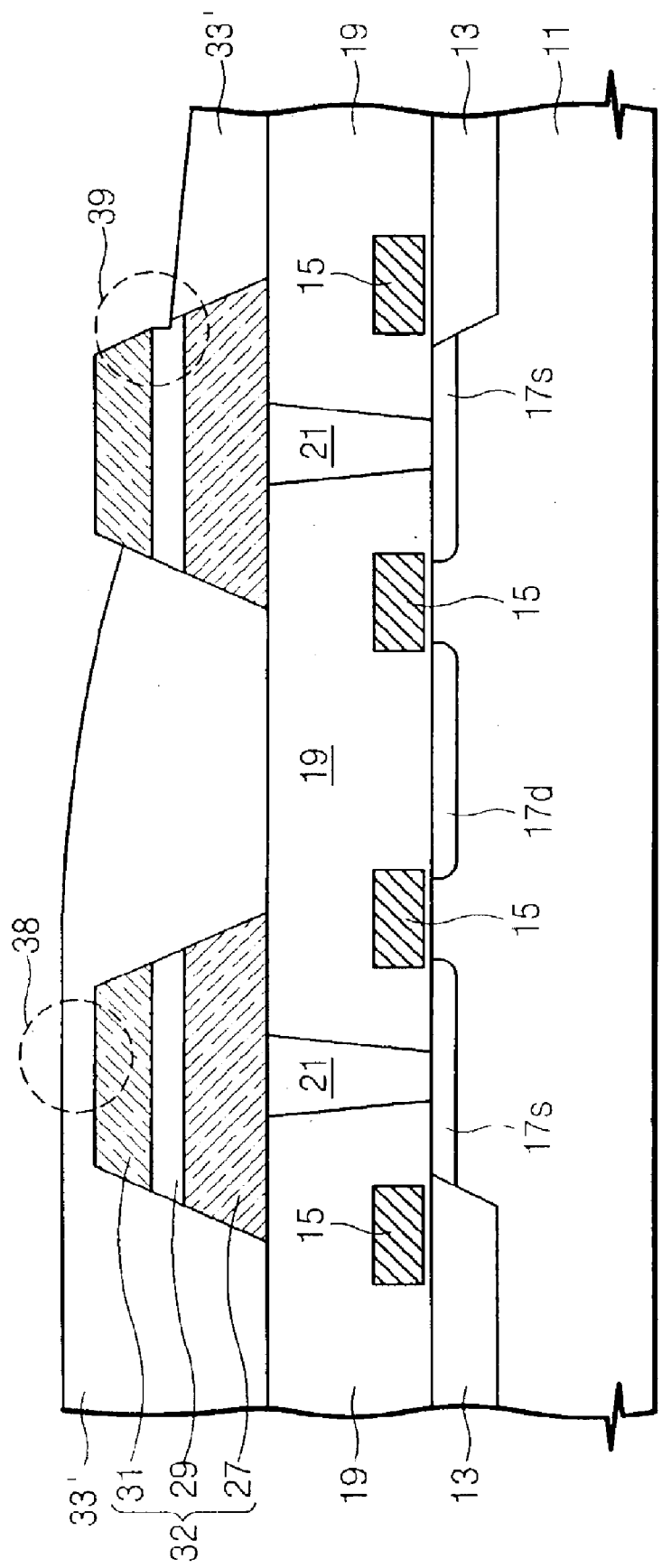

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. It will also be understood that when an element is referred to as being "coupled" or "connected" to another element, it can be directly coupled or connected to the other element, or intervening elements may also be present. Like numbers refer to like elements throughout.

This disclosure also uses relative terms, such as "under", "beneath", "upper", and/or "top" to describe some of the elements in the embodiments. These relative terms are used for the sake of convenience and clarity when referring to the drawings, but are not to be construed to mean that the elements so described can only be positioned relative to one another as shown. For example, when a first element is described as being under a second element in the viewer's frame of reference, it will be understood that the first element may also be located over the second element, if the embodiment were viewed from a different frame of reference, such as if the entire structure were inverted.

Figure 4:
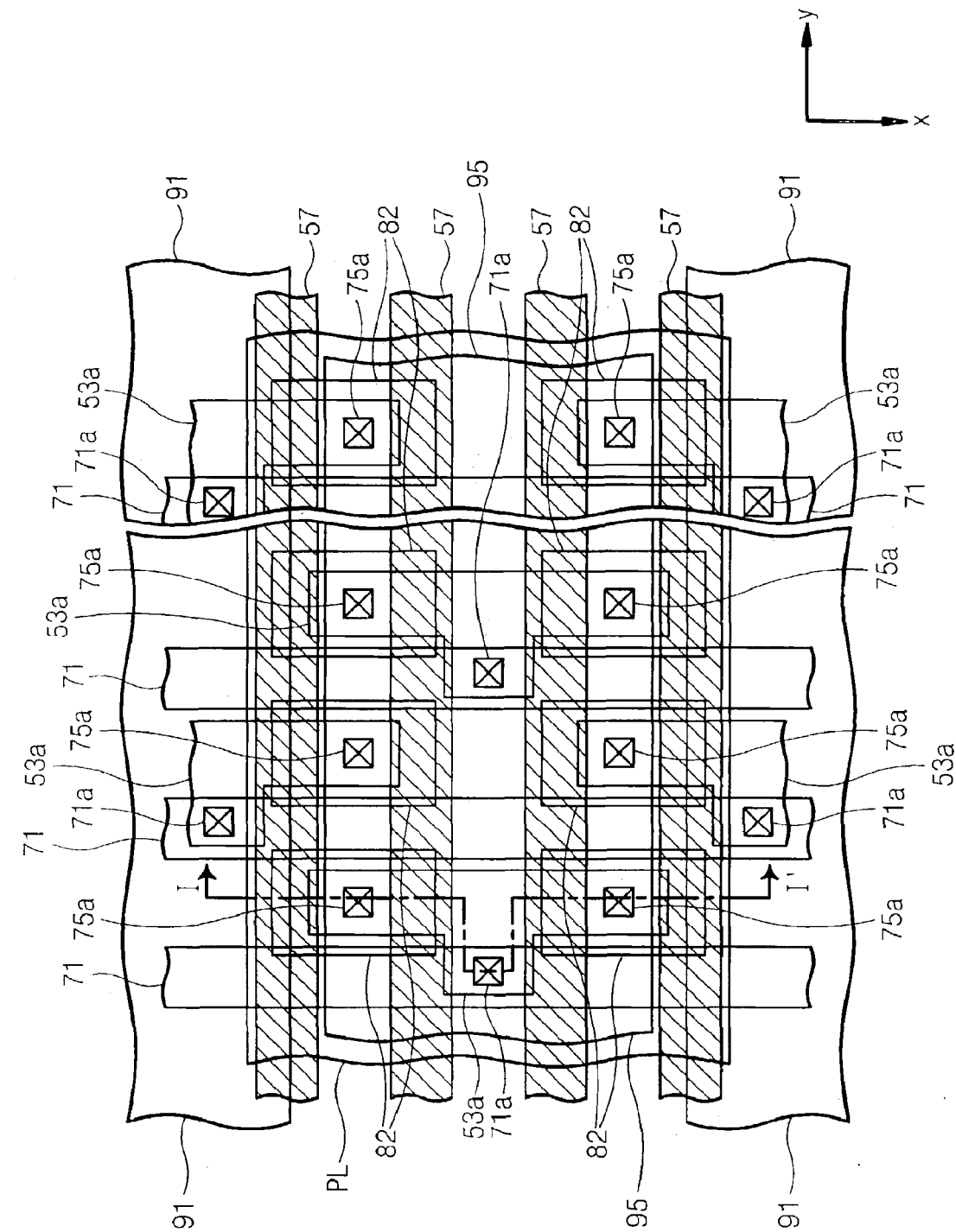
FIG. 4 is a top plan view of a ferroelectric memory device.

Ferroelectric memory devices are now described below with reference to FIG. 4. Referring to FIG. 4, a device isolation layer is disposed at a predetermined region of a semiconductor device to define a plurality of active regions 53a. A plurality of insulated gate electrodes 57 are disposed across the active regions 53a and the device isolation layer. The gate electrodes 57 may provide respective wordlines and are parallel in a row direction (y-axis). Each of the active regions 53a intersects a pair of gate electrodes 57. Accordingly, each of the active regions 53a is divided into three parts. A common drain region is provided at an active region 53a between the pair of the gate electrodes 57, and source regions are provided at active regions 53a adjacent to opposite sides of the common drain region. Thus, cell transistors may be disposed at intersections of the gate electrodes 57 and the active regions 53a. The cell transistors can be 2-dimensionally disposed in a column direction (x-axis) and a row direction (y-axis).

A plurality of bitlines 71 are provided across the wordlines 57 to be electrically connected to common drain regions. Bitline contact holes 71a are provided at intersections of the common drain regions and the bitlines 71. The bitline contact holes 71a provide electrical connection between the common drain regions and respective bitlines. The bitline contact holes 7 a can be filled with respective bitline pads.

Storage node contact holes 75a are provided over respective source regions and can be filled with respective contact plugs. Ferroelectric capacitors 82 are coupled to respective contact plugs. Each of the ferroelectric capacitors 82 includes a lower electrode, a ferroelectric pattern, and an upper electrode which are sequentially stacked. Each lower electrode is electrically connected to source region through a contact plug.

The upper electrodes of the ferroelectric capacitors 82 are connected to at least one plate line. A plate line can be connected to ferroelectric capacitors 82 on at least two adjacent rows. A main wordline 91 (coupled to the gate electrodes 57) can be sandwiched between the plate lines.

Figure 5:
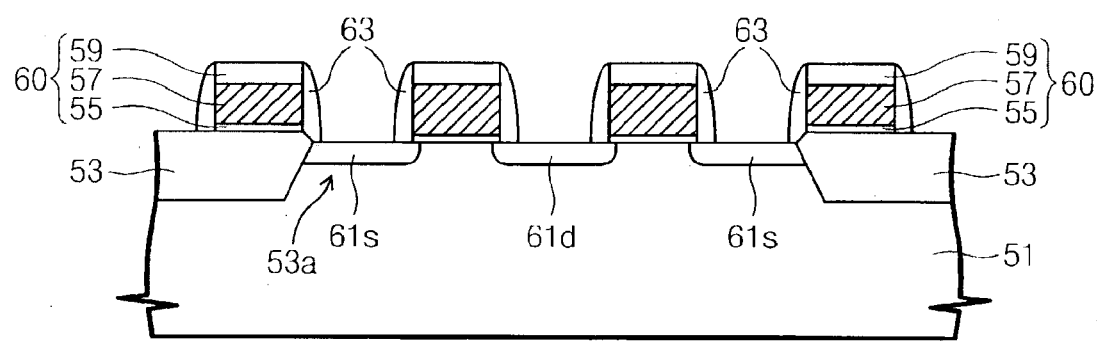
FIGS. 5–10 are cross-sectional views illustrating steps of fabricating ferroelectric memory devices according to embodiments of the present invention.

Methods of fabricating ferroelectric memory devices according to embodiments of the present invention are now described below with reference to FIGS. 5–10 which are cross-sectional views taken along a line I–I' of FIG. 4. Referring to FIG. 5, device isolation layers 53 can be formed at predetermined: regions of a semiconductor substrate 51 to define a plurality of active regions 53a. A gate insulation layer, a gate conductive layer, and a capping insulation layer can be sequentially formed on an entire surface of a semiconductor substrate where the active regions are formed. The capping insulation layer, the gate conductive layer, and the gate insulation layer can then be successively patterned to form a plurality of gate patterns 60 crossing over the active regions and the device isolation layers 53. Each of the gate patterns 60 includes a gate insulation layer pattern 55, a gate electrode 57, and a capping insulation layer pattern 59 which are sequentially stacked. A pair of gate electrodes 57 may cross each active region, and each gate electrode 57 may provide a wordline.

Using the gate patterns 60 and the device isolation layer 53 as ion implanting masks, impurities (dopants) can be implanted into the active regions to provide three impurity regions at each active region. A central impurity region may provide a common drain region 61d, and the other impurity regions may provide respective source regions 61s. A pair of cell transistors can be formed at each active region. The cell transistors can be 2-dimensionally disposed on the semiconductor substrate 51 in row and column directions. Insulating spacers 63 can be formed on sidewalls of the gate patterns 60.

Figure 6:
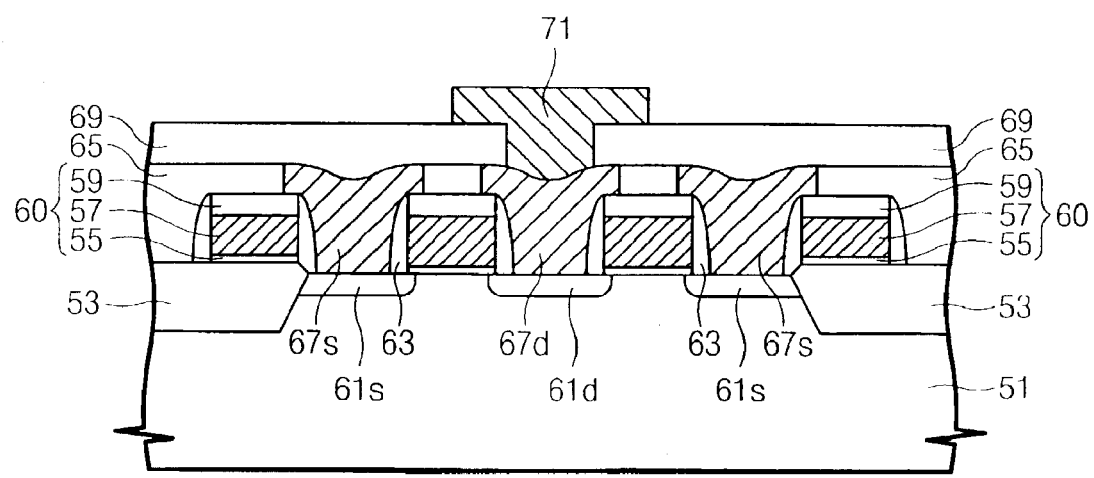

Referring to FIG. 6, a first lower interlayer dielectric 65 can be formed on an entire surface of a structure including gate patterns 60 and spacers 63. The first lower interlayer dielectric 65 can be patterned to form pad contact holes exposing the source/drain regions 61s and 61d. Storage node pads 67s and bitline pads 67d can be formed in the pad contact holes. The storage node pads 67s are coupled to the source regions 61s, and the bitline pads 67d are coupled to the common drain region 61d. A second lower interlayer dielectric 69 can be formed on a surface of the structure including first lower interlayer dielectric 65 and pads 67s and 67d. The second lower interlayer dielectric 69 is patterned to form bitline contact holes 71a (see FIG. 4) exposing the bitline pads 67d. A plurality of bitlines 71 can be formed covering the bitline contact holes. Bitlines 71 cross over wordlines 57.

Figure 7:
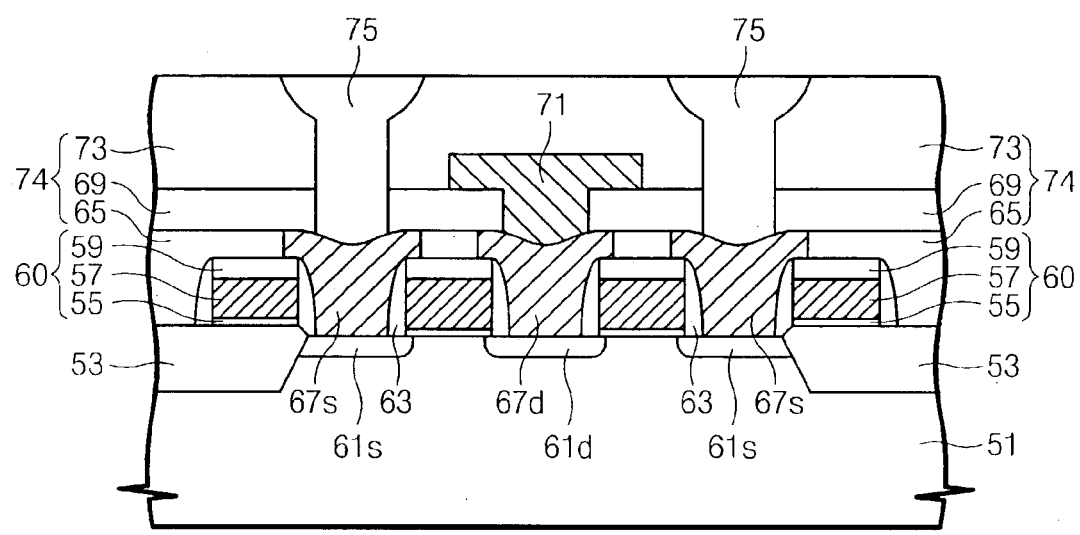

Referring to FIG. 7, a third lower interlayer dielectric 73 can be formed on an entire surface of a semiconductor substrate including the bitlines 71. The first, second, and third interlayer dielectrics 65, 69 and 73 may provide a lower interlayer dielectric 74. The second and third interlayer dielectrics 69 and 73 can be patterned to provide storage node contact holes 75a (see FIG. 4) exposing the storage node pads 67s. To increase an upper diameter of the storage node contacts, the storage node contact holes may be formed using a dry etch or a wet etch. Accordingly an upper sidewall of the storage node contact hole may have a sloped profile, as shown in FIG. 7. The sloped profile may reduce an electrical resistance between a later-formed lower electrode and the source region 61s. Contact plugs 75 can be formed in respective storage node contact holes.

Figure 8:
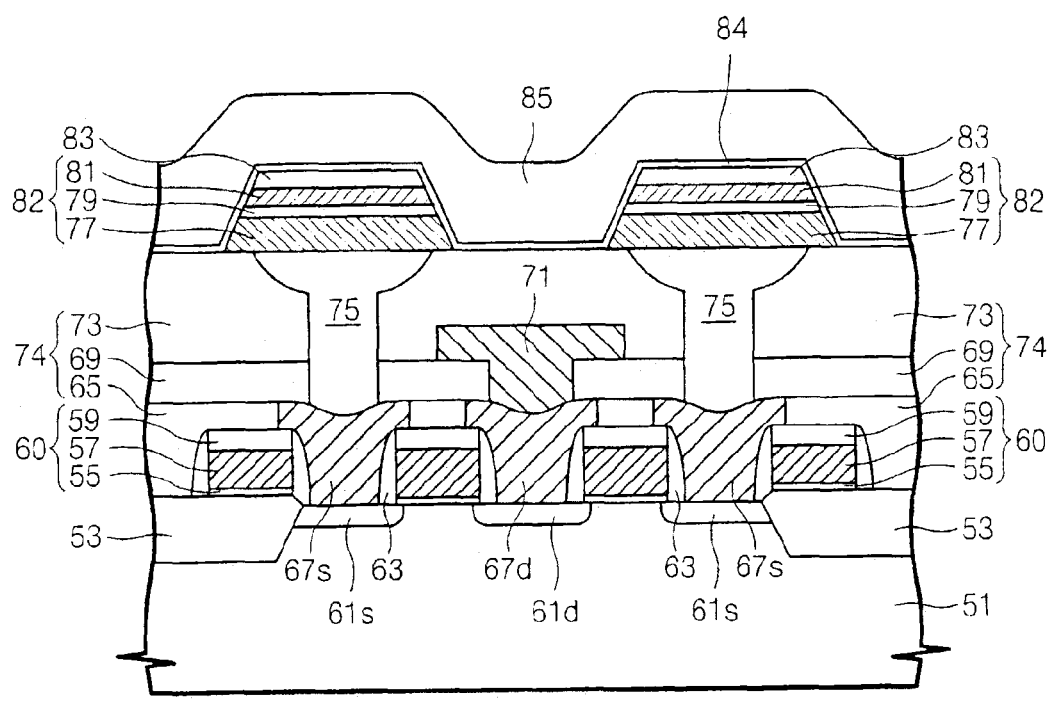

Referring to FIG. 8, a lower electrode layer, a ferroelectric layer, an upper electrode layer, and a hard mask layer can be sequentially formed on the contact plugs 75 and the lower interlayer dielectric 74. The hard mask layer can be patterned to form hard mask patterns 83 covering predetermined regions of the upper electrode layer. The predetermined regions covered with the hard mask patterns 83 can be patterned into ferroelectric capacitors over contact plugs 75. Using the hard mask pattern 83 as an etching mask, the upper electrode layer, the ferroelectric layer, and the lower electrode layer can be successively patterned to form a plurality of ferroelectric capacitors 82 which are 2-dimensionally disposed in row and column directions. Each of the ferroelectric capacitors 82 can include a lower electrode 77, a ferroelectric pattern 79, and an upper electrode 81 which are sequentially stacked. The lower electrodes 77 contact respective contact plugs. As a result, lower electrodes 77 of ferroelectric capacitors 82 can be electrically connected to respective source regions 61s.

The upper electrodes 81 and the lower electrodes 77 can include a layer of at least one selected from the group consisting of ruthenium (Ru), platinum (Pt), iridium (Ir), rhodium (Rh), osmium (Os), and/or oxides thereof. The upper electrodes 81 and the lower electrodes 77 may alternately include a layer of at least-one selected from the group consisting of $SrRuO_3$, $LaNiO_3$, LSCO, and/or YBCO. The ferroelectric pattern 79 may include a material having a ferroelectric property such as PZT, SBT, and BLT. The ferroelectric pattern 79 may include a layer of at least one material selected from the group of consisting of $Pb(Zr,Ti)O_3$, $SrTiO_3$, $BaTiO_3$, $(Ba,Sr)TiO_3$, $SrBi_2Ta_2O_9$, $(Pb,La)(Zr,Ti)O_3$, $Bi_4Ti_3O_{12}$, and/or $(Bi,La)_4Ti_3O_{12}$.

The hard mask pattern 83 may be a layer of a material having an etch selectivity with respect to silicon oxide as well as with respect to the upper and lower electrodes. The hard mask pattern can be made of silicon nitride or a combination of silicon nitride and titanium nitride which are sequentially stacked.

An inter-metal dielectric 85 can be formed on an entire surface of the structure including the ferroelectric capacitors 82. The inter-metal dielectric 85 can be made of silicon oxide. Prior to formation of the inter-metal dielectric 85, a hydrogen barrier layer 84 may be formed on at least a sidewall of the ferroelectric capacitor 82. The hydrogen barrier layer 84 can include a layer of at least one selected from the group consisting of titanium oxide ($TiO_2$), aluminum oxide ($Al_2O_3$), zirconium oxide ($ZrO_2$), and cerium oxide ($CeO_2$). The hydrogen barrier layer 84 may reduce hydrogen atoms reaching the ferroelectric pattern 79. The hydrogen barrier layer 84 can increase reliability of the ferroelectric memory device.

Figure 9:
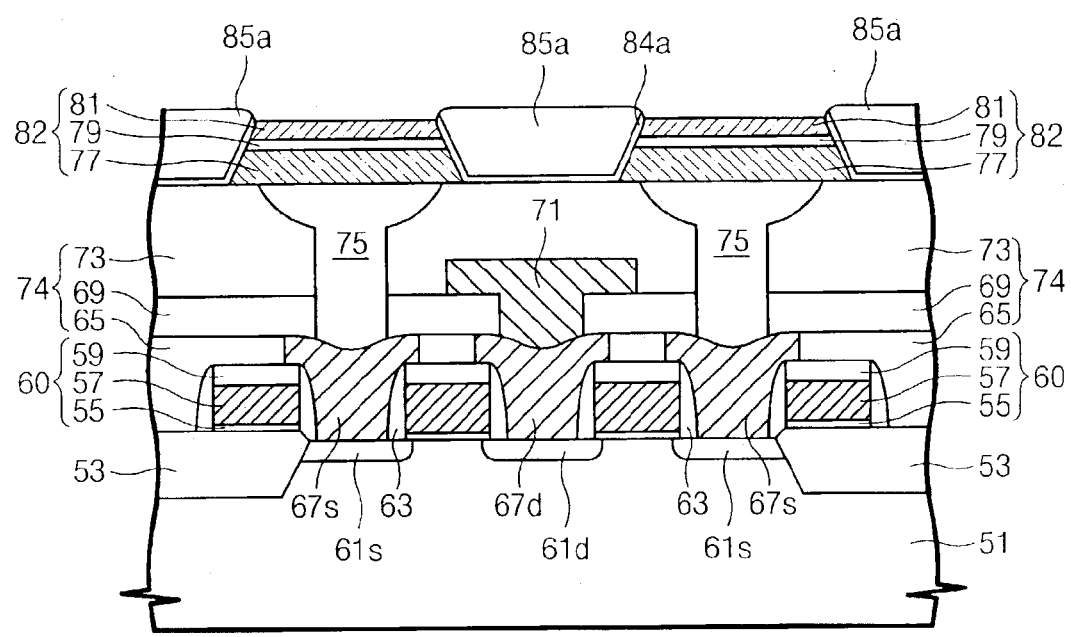

Referring to FIG. 9, the inter-metal dielectric 85 and the hydrogen barrier layer 84 can be planarized to form an inter-metal dielectric pattern 85a exposing a top surface of the hard mask pattern 83 and a hydrogen barrier pattern 84a. The inter-metal dielectric pattern 85a may surround the ferroelectric capacitors 82, and the hydrogen barrier pattern 84a may cover a bottom side and a sidewall of the inter-metal dielectric pattern 85a. The planarization of the inter-metal dielectric 85 and the hydrogen barrier layer 84 can be done using an etch-back process or a chemical mechanical polishing (CMP) process.

The final thickness of the inter-metal dielectric pattern 85a may vary across different positions on a wafer. Formation of the hard mask pattern 83 can reduce deviations in etch thicknesses. A thickness of the hard mask pattern 83 can be greater than a maximum expected thickness deviation across different positions on the wafer. Portions of the hard mask pattern 83 remaining after the planarization process may have a thickness ranging from 50 nanometers to 200 nanometers. The planarization process may thus be carried out using an overetch such that hard mask patterns 83 are exposed across an entire surface of the wafer. As a result, the ferroelectric patterns 79 may remain unexposed during the planarization process while maintaining original thicknesses of the upper electrodes 81.

The hard mask layer can be recessed in an etching process for forming the ferroelectric capacitor 82, causing remaining portions of hard mask pattern 83 to be thinner than the initially-formed hard mask layer. During formation of the hard mask layer, there may be a need to consider a thickness of recess thereof. The thickness of the hard mask pattern can be greater than a maximum expected etch thickness deviation plus a recess thickness due to overetch.

The exposed hard mask patterns 83 can be selectively removed to expose the upper electrodes 81. The exposure of the upper electrodes 81 can be done using an etch recipe having an etch selectivity with respect to the inter-metal dielectric patterns 85a, the hydrogen barrier patterns 84a, and the upper electrodes 81. The removal of the hard mask pattern 83 can be done using a wet etch with an etchant containing a phosphoric acid.

Figure 10:
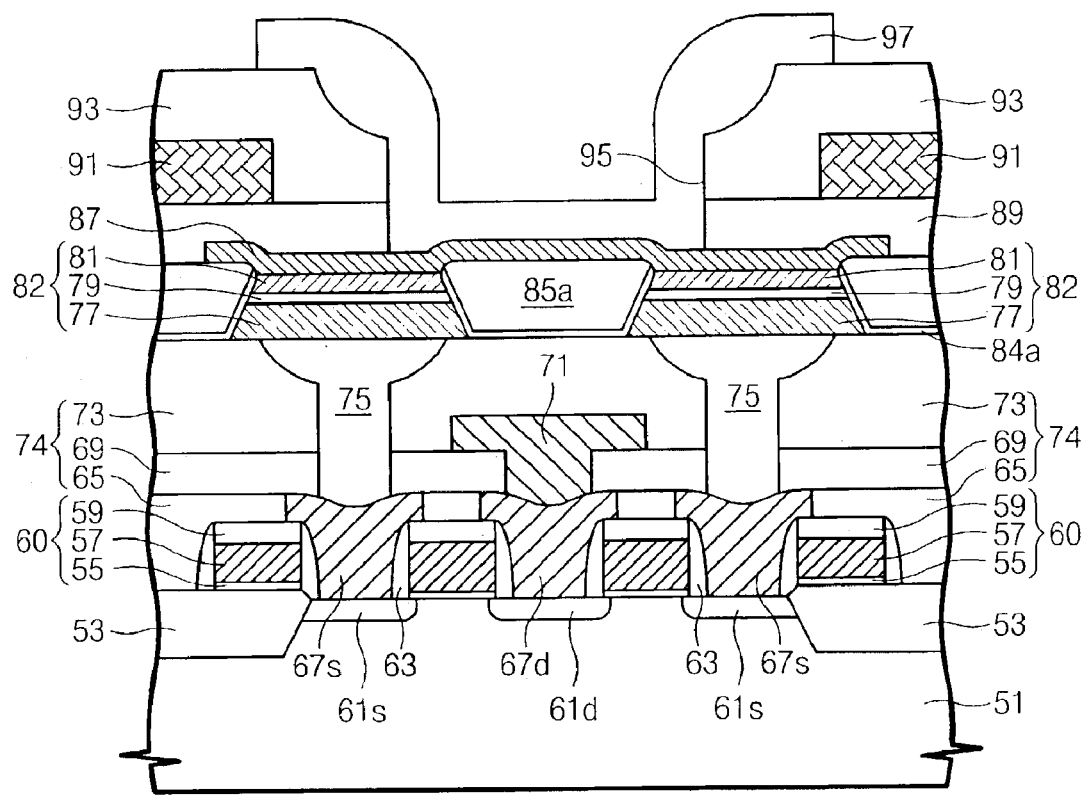

Referring to FIG. 10, a lower plate film can be formed on a surface of the structure including the exposed upper electrodes 81. The lower plate film can be patterned to provide a plurality of local plate lines 87 (PL shown in FIG. 4) which are parallel with the wordlines 57. The local plate lines 87 can be parallel in a row direction (y-axis). Each of the local plate lines 87 can be in direct contact with the upper electrodes 81 disposed along two adjacent rows. The local plate lines 87 may cover a portion of a top surface of the inter-metal dielectric pattern 85a. The lower plate film may include a layer of at least one selected from the group consisting of ruthenium (Ru), platinum (Pt), iridium (Ir), rhodium (Rh), osmium (Os), palladium (Pd), and/or an oxide(s) thereof.

An upper interlayer dielectric can be formed on a surface of the structure including the local plate lines 87. The upper interlayer dielectric may include a first upper interlayer dielectric 89 and a second interlayer dielectric 93 which are sequentially stacked. Before the second upper interlayer dielectric 93 is formed, a plurality of main wordlines 91 may be formed on the first upper interlayer dielectric 89. One main wordline 91 may control four wordlines 57 through a decoder.

The upper interlayer dielectric can be patterned to form a slit-type via hole 95 exposing portions of the local plate line 87. The slit-type via hole 95 can be disposed between the main wordlines 91 to be parallel with the main wordlines 91. An upper plate film such as a metal film can be formed on an entire surface of the resultant structure where the slit-type via hole 95 is formed. The upper plate film can be patterned to form a main plate line 97 covering the slit-type via hole 95. The local plate line 87 and the main plate line 97 may constitute a plate line. However, only one and/or the other of the local and main plate lines 87 and 97 may constitute the plate line.

As discussed above, a hard mask pattern having a sufficient thickness can be used as an etching mask for forming a ferroelectric capacitor. Accordingly, although an upper electrode of a ferroelectric capacitor is not thickly formed, a ferroelectric pattern can remain unexposed during planarization of an inter-metal dielectric. As a result, a thickness of the ferroelectric capacitor can be reduced and a ferroelectric memory device having improved characteristics can be fabricated.

A hard mask according to embodiments of the present invention can thus be used to pattern electrode and dielectric layers of a capacitor and to also protect the capacitor electrodes and dielectric when planarizing an interlayer insulating layer thereon. By providing the hard mask layer with a thickness greater than a variation in thickness of the interlayer insulating layer after planarization, the hard masks of all of the capacitor structures on a wafer can be exposed without exposing sidewalls of dielectric layers of the capacitor structures. The hard masks can then be selectively removed to expose the upper electrodes without exposing the dielectric sidewalls of the capacitor structures.

According to embodiments of the present invention methods of fabricating a ferroelectric capacitor may provide reduced thicknesses of upper electrodes. In accordance with embodiments of the present invention, a method of fabricating a ferroelectric memory device may include using a selectively removable hard mask pattern as an etch mask for forming a ferroelectric capacitor. This method may include forming a lower interlayer dielectric on a semiconductor substrate, sequentially stacking a ferroelectric capacitor and a hard mask pattern on the lower interlayer dielectric, forming an inter-metal dielectric to cover an entire surface of a resultant structure where the hard mask pattern is formed, and planarizing the inter-metal dielectric to expose the hard mask pattern. The exposed hard mask pattern can be selectively removed to expose a top surface of the ferroelectric capacitor, and then a plate line can be formed to be in contact with a top surface of the ferroelectric capacitor.

The selectively removable hard mask pattern may make it possible to reduce a problem associated with an etch thickness deviation occurring during exposure of the top surface of the ferroelectric capacitor. The hard mask pattern can be made of a material having an etch selectivity with respect to the inter-metal dielectric. For example, the hard mask pattern can be made of silicon nitride or silicon nitride and titanium nitride which are sequentially stacked. Materials of the hard mask pattern and the inter-metal dielectric can be selected such that a first etch chemistry can be used to selectively etch the inter-metal dielectric without significantly etching the hard mask pattern, and such that a second etch chemistry can be used to selectively etch the hard mask pattern without significantly etching the inter-metal dielectric or the upper electrode.

The formation of the ferroelectric capacitor and the hard mask pattern can include sequentially stacking a lower electrode layer, a ferroelectric layer, an upper electrode layer, and a hard mask layer on the lower interlayer dielectric, and patterning the hard mask layer to form a hard mask pattern. Using the hard mask pattern as a mask, the upper electrode layer, the ferroelectric layer, and the lower electrode layer can be sequentially patterned to form a lower electrode, a ferroelectric pattern, and an upper electrode which are sequentially stacked. Preferably, the lower electrode layer and the upper electrode layer can be made of at least one selected from the group consisting of ruthenium (Ru), platinum (Pt), iridium (Ir), rhodium (Rh), osmium (Os),. and/or oxides thereof. The lower and upper electrode layers may be made of one selected from the group consisting of $SrRuO_3$, $LaNiO_3$, LSCO, and/or YBCO. The ferroelectric layer can be made of at least one selected from the group consisting of PZT, SBT, and/or BLT.

The planarization of the inter-metal dielectric can be done by a chemical mechanical polishing (CMP) process or an etch-back process. The selective removal of the hard mask pattern can be done using an etch recipe having an etch selectivity with respect to the inter-metal dielectric and the ferroelectric capacitor. The selective removal thereof can be done using an etchant containing phosphoric acid.

To reduce problems associated with etch thickness deviation, a thickness of the hard mask pattern can be greater than a thickness deviation occurring in the planarization of the inter-metal dielectric. Thus, the hard mask pattern can have a thickness in the range of approximately 50 nanometers to 200 nanometers.

Prior to formation of the inter-metal dielectric, a hydrogen barrier layer can also be formed to cover at least a sidewall of the ferroelectric capacitor. The oxygen barrier layer can be made of at least one selected from the group consisting of titanium oxide ($TiO_2$), aluminum oxide ($Al_2O_3$), zirconium oxide ($ZrO_2$), and/or cerium oxide ($CeO_2$). The inter-metal dielectric can be made of silicon oxide.

While this invention has been particularly shown and described with reference to preferred embodiments thereof, it will be understood by those skilled in the art that various changes in form and details may be made therein without departing from the spirit and scope of the invention as defined by the appended claims and their equivalents.

What is claimed is:

1. A method for forming an electronic device, the method comprising:
    forming a capacitor structure on a portion of a substrate, the capacitor structure including a first electrode on the substrate, a capacitor dielectric on the first electrode, a second electrode on the dielectric, and a hard mask on the second electrode so that the capacitor dielectric is between the first and second electrodes, so that the first electrode and the capacitor dielectric are between the second electrode and the substrate, and so that the first and second electrodes and the capacitor dielectric are between the hard mask and the substrate;
    forming an interlayer dielectric layer on the hard mask and on portions of the substrate surrounding the capacitor structure;
    removing portions of the interlayer dielectric layer to expose the hard mask while maintaining portions of the interlayer dielectric layer on portions of the substrate surrounding the capacitor structure wherein removing portions of the interlayer dielectric layer comprises planarizing the interlayer dielectric layer to a level of the hard mask; and
    removing the hard mask thereby exposing portions of the second electrode while maintaining the portions of the interlayer dielectric layer on portions of the substrate surrounding the capacitor.

2. A method according to claim 1 further comprising:
    after removing the hard mask, forming a plate line on the exposed portions of the second electrode.

3. A method according to claim 1 wherein the capacitor dielectric comprises a ferroelectric material.

4. A method according to claim 3 wherein the ferroelectric material comprises a material selected from the group consisting of PZT, SBT, and/or BLT.

5. A method according to claim 1 wherein planarizing the interlayer dielectric layer comprises at least one of chemical mechanical polishing and/or an etching back.

6. A method according to claim 1 wherein the interlayer dielectric layer, the hard mask, and the second electrode comprise different materials.

7. A method according to claim 6 wherein the hard mask comprises a layer of at least one material selected from the group consisting of silicon nitride and/or titanium nitride.

8. A method according to claim 1 wherein each of the first and second electrodes comprises at least one material selected from the group consisting of ruthenium (Ru), platinum (Pt), iridium (Ir), rhodium (Rh), osmium (Os), and/or oxides thereof.

9. A method according to claim 1 wherein the hard mask has a thickness in the range of approximately 50 nanometers to 200 nanometers.

10. A method according to claim 1 wherein the interlayer dielectric layer comprises silicon oxide.

11. A method according to claim 1 further comprising:
prior to forming the capacitor structure, forming a memory cell access transistor wherein the first electrode of the capacitor structure is electrically connected to a source/drain region of the memory cell access transistor.

12. A method according to claim 11 further comprising:
prior to forming the capacitor structure, forming an insulating layer on the memory cell access transistor, the insulating layer including a via therein exposing a portion of the source/drain region of the memory cell access transistor, and the first electrode being electrically connected to the source/drain region through the via.

13. A method for forming an electronic device, the method comprising:
forming a capacitor structure on a portion of a substrate, the capacitor structure including a first electrode on the substrate, a capacitor dielectric on the first electrode, a second electrode on the dielectric, and a hard mask on the second electrode so that the capacitor dielectric is between the first and second electrodes, so that the first electrode and the capacitor dielectric are between the second electrode and the substrate, and so that the first and second electrodes and the capacitor dielectric are between the hard mask and the substrate;
forming an interlayer dielectric layer on the hard mask and on portions of the substrate surrounding the capacitor structure;
removing portions of the interlayer dielectric layer to expose the hard mask while maintaining portions of the interlayer dielectric layer on Portions of the substrate surrounding the capacitor structure; and
removing the hard mask thereby exposing portions of the second electrode while maintaining the portions of the interlayer dielectric layer on portions of the substrate surrounding the capacitor;
wherein the interlayer dielectric layer, the hard mask, and the second electrode comprise different materials and wherein removing the hard mask comprises etching the hard mask using an etchant that selectively etches the hard mask with respect to the interlayer dielectric layer and the second electrode.

14. A method according to claim 13 wherein the etchant comprises phosphoric acid.

15. A method for forming an electronic device, the method comprising:
forming a capacitor structure on a portion of a substrate, the capacitor structure including a first electrode on the substrate, a capacitor dielectric on the first electrode, a second electrode on the dielectric, and a hard mask on the second electrode so that the capacitor dielectric is between the first and second electrodes, so that the first electrode and the capacitor dielectric are between the second electrode and the substrate, and so that the first and second electrodes and the capacitor dielectric are between the hard mask and the substrate wherein forming the capacitor structure comprises,
forming a first electrode layer on the substrate,
forming a dielectric layer on the first electrode layer opposite the substrate,
forming a second electrode layer on the dielectric layer opposite the first electrode layer and the substrate,
forming a hard mask layer on the second electrode layer opposite the dielectric layer, the first electrode layer, and the substrate,
patterning the hard mask layer to provide the hard mask on the second electrode layer, and
etching portions of the second electrode layer, the dielectric layer, and the first electrode layer using the hard mask as an etching mask to provide the first electrode, the capacitor dielectric, and the second electrode;
forming an interlayer dielectric layer on the hard mask and on portions of the substrate surrounding the capacitor structure;
removing portions of the interlayer dielectric layer to expose the hard mask while maintaining portions of the interlayer dielectric layer on portions of the substrate surrounding the capacitor structure; and
removing the hard mask thereby exposing portions of the second electrode while maintaining the portions of the interlayer dielectric layer on portions of the substrate surrounding the capacitor.

16. A method for forming an electronic device, the method comprising:
forming a capacitor structure on a portion of a substrate, the capacitor structure including a first electrode on the substrate, a capacitor dielectric on the first electrode, a second electrode on the dielectric, and a hard mask on the second electrode so that the capacitor dielectric is between the first and second electrodes, so that the first electrode and the capacitor dielectric are between the second electrode and the substrate, and so that the first and second electrodes and the capacitor dielectric are between the hard mask and the substrate;
forming an interlayer dielectric layer on the hard mask and on portions of the substrate surrounding the capacitor structure;
removing portions of the interlayer dielectric layer to expose the hard mask while maintaining portions of the interlayer dielectric layer on portions of the substrate surrounding the capacitor structure; and
removing the hard mask thereby exposing portions of the second electrode while maintaining the portions of the interlayer dielectric layer on portions of the substrate surrounding the capacitor;
wherein a thickness of the hard mask is greater than a variation in thickness of the portion of the interlayer dielectric layer maintained on portions of the substrate surrounding the capacitor structure after removing portions of the interlayer dielectric layer.

17. A method according to claim 16 wherein removing portions of the interlayer dielectric layer comprises planarizing the interlayer dielectric layer to a level of the hard mask.

18. A method for forming an electronic device, the method comprising:

forming a capacitor structure on a portion of a substrate, the capacitor structure including a first electrode on the substrate, a capacitor dielectric on the first electrode, a second electrode on the dielectric, and a hard mask on the second electrode so that the capacitor dielectric is between the first and second electrodes, so that the first electrode and the capacitor dielectric are between the second electrode and the substrate, and so that the first and second electrodes and the capacitor dielectric are between the hard mask and the substrate;

forming a hydrogen barrier layer on the capacitor structure including the hard mask, the first and second electrodes, and the capacitor dielectric;

after forming the hydrogen barrier layer, forming an interlayer dielectric layer on the hard mask and on portions of the substrate surrounding the capacitor structure;

removing portions of the interlayer dielectric layer to expose the hard mask while maintaining portions of the interlayer dielectric layer on portions of the substrate surrounding the capacitor structure; and removing the hard mask thereby exposing portions of the second electrode while maintaining the portions of the interlayer dielectric layer on portions of the substrate surrounding the capacitor.

19. A method according to claim 18 wherein the hydrogen barrier layer comprises a material selected from the group consisting of titanium oxide ($TiO_2$), aluminum oxide ($Al_2O_3$), zirconium oxide ($ZrO_2$), and cerium oxide ($CeO_2$).

20. A method of fabricating a ferroelectric memory device, comprising:

forming a lower interlayer dielectric on a semiconductor substrate;

sequentially stacking a ferroelectric capacitor and a hard mask pattern on the lower interlayer dielectric;

forming an inter-metal dielectric to cover an entire surface of the semiconductor substrate including the hard mask pattern;

planarizing the inter-metal dielectric to expose the hard mask pattern;

selectively removing the exposed hard mask pattern to expose a top surface of the ferroelectric capacitor; and forming a plate line contacting with the top surface of the ferroelectric capacitor.

21. The method as set forth in claim 20, wherein the hard mask pattern is made of a material having an etch selectivity with respect to the inter-metal dielectric.

22. The method as set forth in claim 20, wherein the hard mask pattern is made of silicon nitride or silicon nitride and titanium nitride which are sequentially stacked.

23. The method as set forth in claim 20, wherein the formation of the ferroelectric capacitor and the hard mask pattern comprises:

sequentially stacking a lower electrode layer, a ferroelectric layer, an upper electrode layer, and a hard mask layer on the lower interlayer dielectric;

patterning the hard mask layer to form a hard mask pattern; and using the hard mask pattern as a mask, successively patterning the upper electrode layer, the ferroelectric layer, and the lower electrode layer to sequentially form a lower electrode, a ferroelectric pattern, and an upper electrode.

24. The method as set forth in claim 23, wherein the lower electrode layer and the upper electrode layer are made of at least one selected from the group consisting of ruthenium (Ru), platinum (Pt), iridium (Ir), rhodium (Rh), osmium (Os), and oxide thereof.

25. The method as set forth in claim 23, wherein the ferroelectric layer is made of one selected from the group consisting of PZT, SBT, and BLT.

26. The method as set forth in claim 20, wherein the planarization of the inter-metal dielectric is done by a chemical mechanical polishing (CMP) process or an etchback process.

27. The method as set forth in claim 20, wherein the selective removal of the hard mask pattern is done using an etch recipe having an etch selectivity with respect to the inter-metal dielectric and the ferroelectric capacitor.

28. The method as set forth in claim 20, wherein the selective removal of the hard mask pattern is done using an etchant containing phosphoric acid.

29. The method as set forth in claim 20, wherein the hard mask pattern has a thickness ranging from 50 nanometers to 200 nanometers.

30. The method as set forth in claim 20, wherein a thickness of the hard mask pattern is greater than a maximum thickness deviation based on the planarization of the inter-metal dielectric.

31. The method as set forth in claim 20, wherein the inter-metal dielectric is made of silicon oxide.

32. The method as set forth in claim 20, prior to formation of the inter-metal dielectric, further comprising forming a hydrogen barrier layer to cover a sidewall of the ferroelectric capacitor.

33. The method as set forth in claim 32, wherein the hydrogen barrier layer is made of at least one selected from the group consisting of titanium oxide ($TiO_2$), aluminum oxide ($Al_2O_3$), zirconium oxide ($ZrO_2$), and cerium oxide ($CeO_2$).

* * * * *